United States Patent
Pak et al.

(10) Patent No.: US 6,947,804 B1
(45) Date of Patent: Sep. 20, 2005

(54) METHOD FOR DETECTING SEQUENTIAL PROCESSING EFFECTS USING ON-TOOL RANDOMIZATION

(75) Inventors: James M. Pak, Sunnyvale, CA (US); Steven J. Zika, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 159 days.

(21) Appl. No.: 10/340,124

(22) Filed: Jan. 10, 2003

(51) Int. Cl.[7] .............................................. G06F 19/00
(52) U.S. Cl. ...................... 700/121; 700/100; 700/108
(58) Field of Search .......................... 700/95, 100, 108, 700/109, 110, 117, 121

(56) References Cited

U.S. PATENT DOCUMENTS

| | | |
|---|---|---|
| 5,716,856 A | 2/1998 | Lin et al. |
| 5,761,065 A | 6/1998 | Kittler et al. |
| 5,930,138 A | 7/1999 | Lin et al. |
| 6,336,086 B1 * | 1/2002 | Perez et al. ................... 703/13 |
| 6,684,125 B2 * | 1/2004 | Kahn et al. .................. 700/218 |

* cited by examiner

Primary Examiner—Leo Picard
Assistant Examiner—Charles Kasenge
(74) Attorney, Agent, or Firm—Winstead Sechrest & Minick P.C.

(57) ABSTRACT

A method for detecting sequential processing effects on integrated circuits to be manufactured in a manufacturing process, includes: determining a first random sequence for a plurality of wafers; performing a first process step on the plurality of wafers by a first process tool in accordance with the first random sequence; determining a second random sequence for the plurality of wafers; and performing a second process step on the plurality of wafers by a second process tool in accordance with the second random sequence. The method performs randomization of wafer processing sequences at the process tool itself. By performing randomization of wafer processing sequences at the process tool, the need for separate wafer handlers is eliminated, resulting in significant cost reduction, clean-room space savings, improved yield, improved manufacturing cycle time, and improved signal-detection capabilities.

20 Claims, 4 Drawing Sheets

METHOD FOR DETECTING SEQUENTIAL PROCESSING EFFECTS USING ON-TOOL RANDOMIZATION

FIELD OF THE INVENTION

The present invention relates to the fabrication of integrated circuits, and more particularly to the monitoring of the manufacturing process of semiconductor wafers on which the integrated circuits are fabricated.

BACKGROUND OF THE INVENTION

The manufacturing of integrated circuits comprises numerous discrete processing steps. The steps begin with a slice of crystal silicon or some other semiconductor material, referred to as a "wafer". The steps of the manufacturing process, such as masking and etching, chemical depositions, etc., are then performed in a specific order on the wafer to fabricate the integrated circuits.

Typically, wafers move through the manufacturing flow in batches, referred to as "lots". The wafers are first placed within a cassette prior to a first process tool or apparatus. The first process tool performs the first step or set of steps of the manufacturing process. The first process tool removes the wafers from the cassette one at a time for processing. As the first process tool finishes with a wafer, it is placed into another cassette or into the same cassette, and then moved to a second process tool. The second process tool also removes the wafers from the cassette one at a time for processing. As the second process tool finishes with a wafer, it is placed into another cassette or into the same cassette and moved to the next process tool. This continues until each step of the manufacturing process is completed. A typical manufacturing process involves several hundred steps, each step performed by a different process tool.

At the completion of the wafer processing, the wafers are tested to determine circuit functionality. The wafer is then sliced, and the functioning integrated circuits on the wafer are packaged. The number of functioning integrated circuits on a wafer relative to the total number of integrated circuits fabricated is referred to as the "yield" of the wafer. However, the yields of the wafers within the same lot may vary. One reason for this within-lot yield variation is the order at which the wafers in the lot are processed at one or more processing steps due to non-optimal condition of the tools at those steps. To determine which processing step(s) could have attributed to the yield variation, the processing sequences of the wafers at various steps are tracked. These orders are then correlated with the wafer-level yield. Randomizing the order of the wafers prior to some of these steps is often done to ensure traceability of significant signals.

In prior analysis practice, the processing sequences and the yields are fed into a factory control system. Then, the graphs of the yields versus the processing sequences are generated. The graphs are analyzed to discern trends in the graphs. However, most processes comprise many steps. Wafer handlers are needed to perform the randomization. Although the randomization of the wafer order before each processing step effectively isolates the step responsible for any significant trend, such practice is cost prohibitive. In a large fabrication where there are many hundreds of process steps, a large number of wafer handlers would be needed for randomization, making the financial costs extremely high. To reduce costs, randomization is performed at intervals of steps, such as at every ten or twenty steps, rather than at each step. Further analysis to isolate the responsible step is then required, reducing the efficiency of the analysis.

Accordingly, there exists a need for an improved method for detecting sequential processing effects on integrated circuits to be manufactured in a manufacturing process. The improved method should allow for randomization at each process tool of the manufacturing process without significantly increasing the costs of manufacturing the integrated circuits. The present invention addresses such a need.

SUMMARY OF THE INVENTION

A method for detecting sequential processing effects on integrated circuits to be manufactured in a manufacturing process, includes: determining a first random sequence for a plurality of wafers; performing a first process step on the plurality of wafers by a first process tool in accordance with the first random sequence; determining a second random sequence for the plurality of wafers; and performing a second process step on the plurality of wafers by a second process tool in accordance with the second random sequence. The method performs randomization of wafer processing sequences at the process tool itself. By performing randomization of wafer processing sequences at the process tool, the need for separate wafer handlers is eliminated, resulting in significant cost reduction, clean-room space savings, improved yield, improved manufacturing cycle time, and improved signal-detection capabilities.

DETAILED DESCRIPTION

The present invention provides an improved method for detecting sequential processing effects on integrated circuits to be manufactured in a manufacturing process. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 1 through 4 in conjunction with the discussion below.

Figure 1:
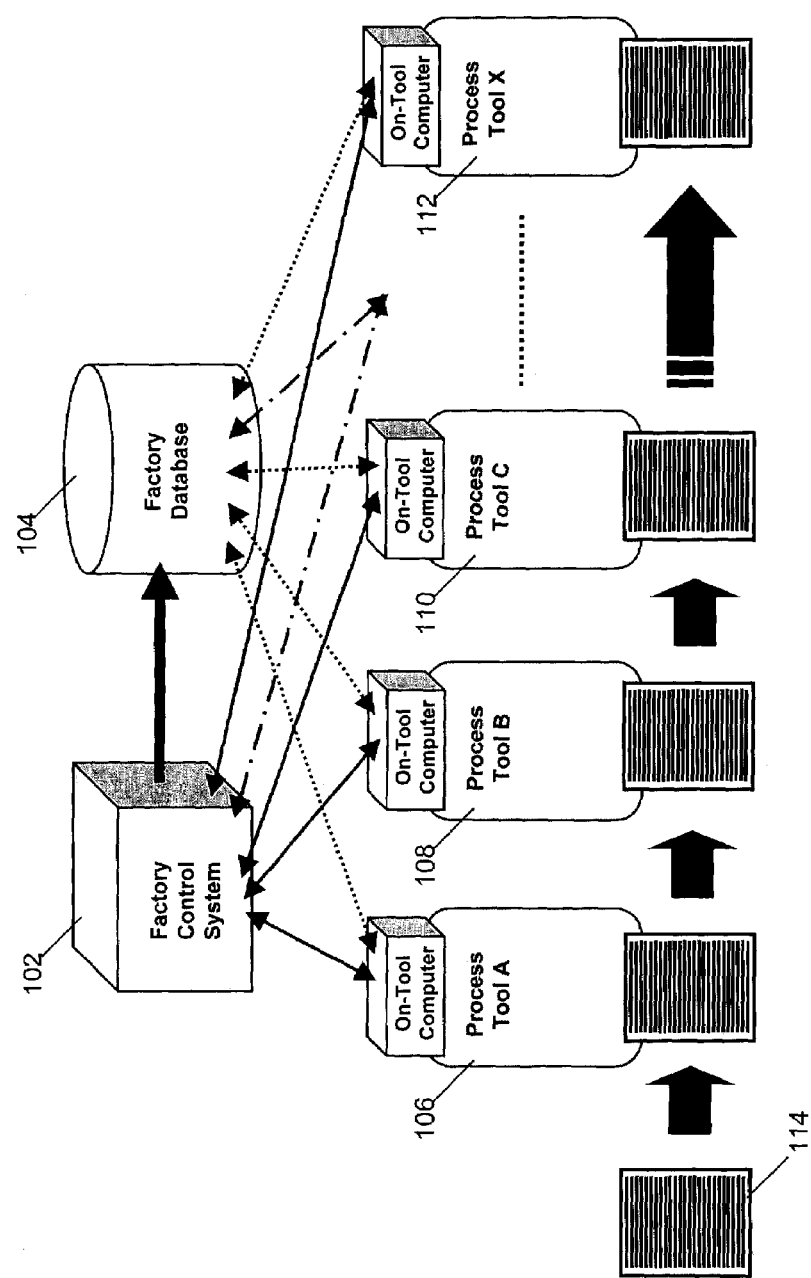
FIG. 1 illustrates a preferred embodiment of a system for manufacturing integrated circuits in accordance with the present invention.

FIG. 1 illustrates a preferred embodiment of a system for manufacturing integrated circuits in accordance with the present invention. The system comprises a factory control system 102, a factory database 104, and a plurality of process tools 106–112. Although four process tools are illustrated, the system can comprise many more process tools between process tools 110 and 112. Each process tool 106–112 comprises an on-tool computer. During the process of a lot of wafers 114, communication occurs between the process tools 106–112, the factory control system 102, and the factory database 104. In the preferred embodiment, the process tools 106–112 are capable of processing the wafers 114 in accordance with random sequences.

Figure 2:
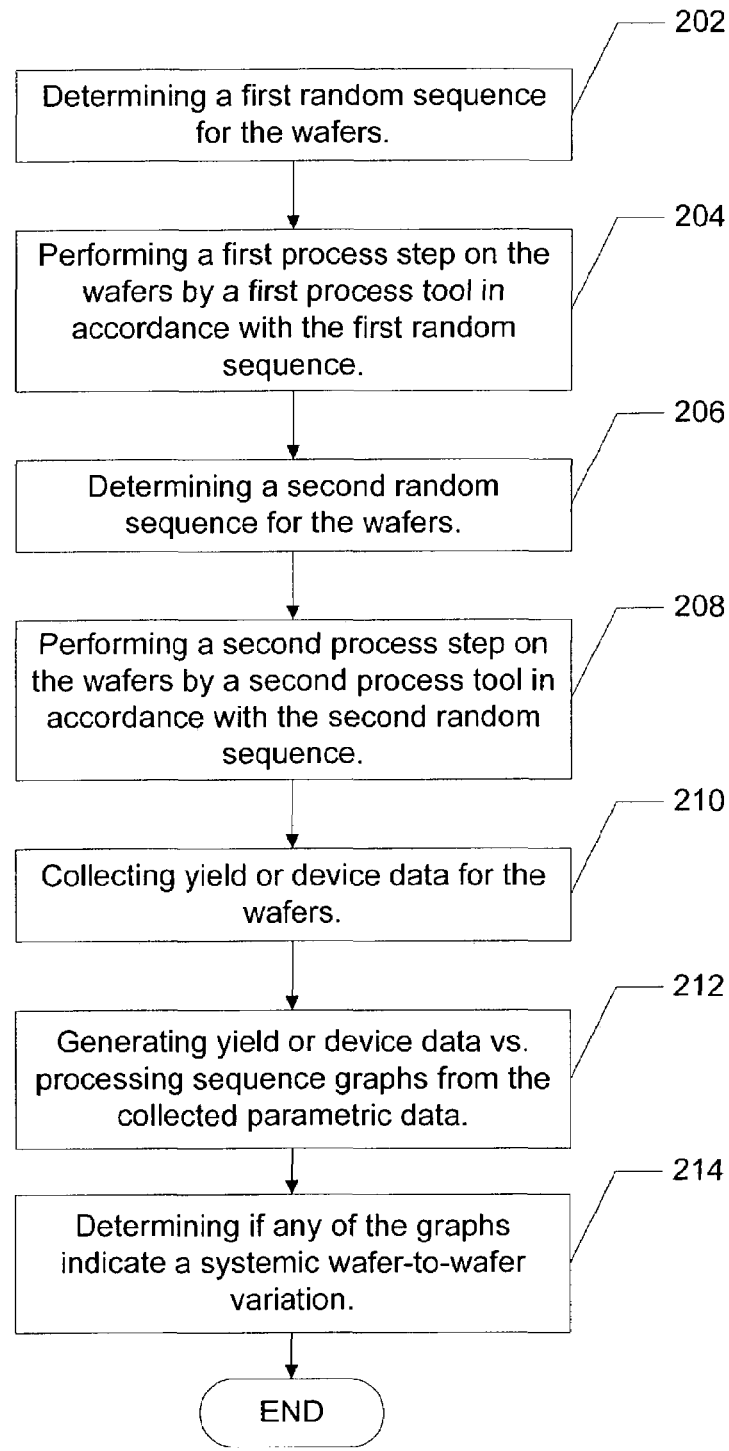
FIG. 2 is a flowchart illustrating a preferred embodiment of a method for detecting sequential processing effects on integrated circuits to be manufactured in a manufacturing process in accordance with the present invention.

FIG. 2 is a flowchart illustrating a preferred embodiment of a method for detecting sequential processing effects on integrated circuits to be manufactured in a manufacturing process in accordance with the present invention. First, a first random sequence is determined for the plurality of wafers in the lot 114, via step 202. Next, a first process step is performed on the wafers 114 by a first process tool, such as process tool 106, in accordance with the first random sequence, via step 204. A second random sequence for the wafers 114 is also determined, via step 206. The second process step is performed on the wafers 114 by a second process tool, such as process tool 108, in accordance with the second random sequence, via step 208. When all of the processing steps have been performed on the wafers 114, yield or device data is collected for them, via step 210. "Yield data", as used in this specification, refers to the number of functioning integrated circuit on a wafer relative to the total number of integrated circuits fabricated. "Device data", as used in this specification, refers to electrical characterization data for the devices fabricated on the wafer. Yield or device data versus processing sequence graphs are then generated from the collected data, via step 212. Then, it is determined if any of the graphs indicate a systemic wafer-to-wafer variation, via step 214.

In the preferred embodiment, the process tools 106–112 themselves have the capability to process the wafers in different orders according to the random sequences generated. This eliminates the need for wafer handlers that sort the wafers prior to a processing step in order to randomize the wafer processing sequence. Eliminating the wafer handlers brings several advantages. There is a significant cost savings as each wafer handler can cost between $100,000 to $500,000 each. There are significant savings in clean-room space as each wafer handler can require up to twenty square feet or more. There is an elimination of defects that can occur due to the extra wafer handling performed by the wafer handlers, improving yield. There is significant improvement in cycle time, since the time required for separate wafer sorting is eliminated. Also, because the process tools 106–112 themselves can process the wafers in different orders according to the random sequence generated, randomization can potentially be implemented at each processing step. This is an improvement over other methods where the randomization is performed every ten to twenty steps. By performing randomization at more of the processing steps, signal-detection capability is improved. The follow-up investigation required to isolate a processing step can be reduced or eliminated.

Figure 3:
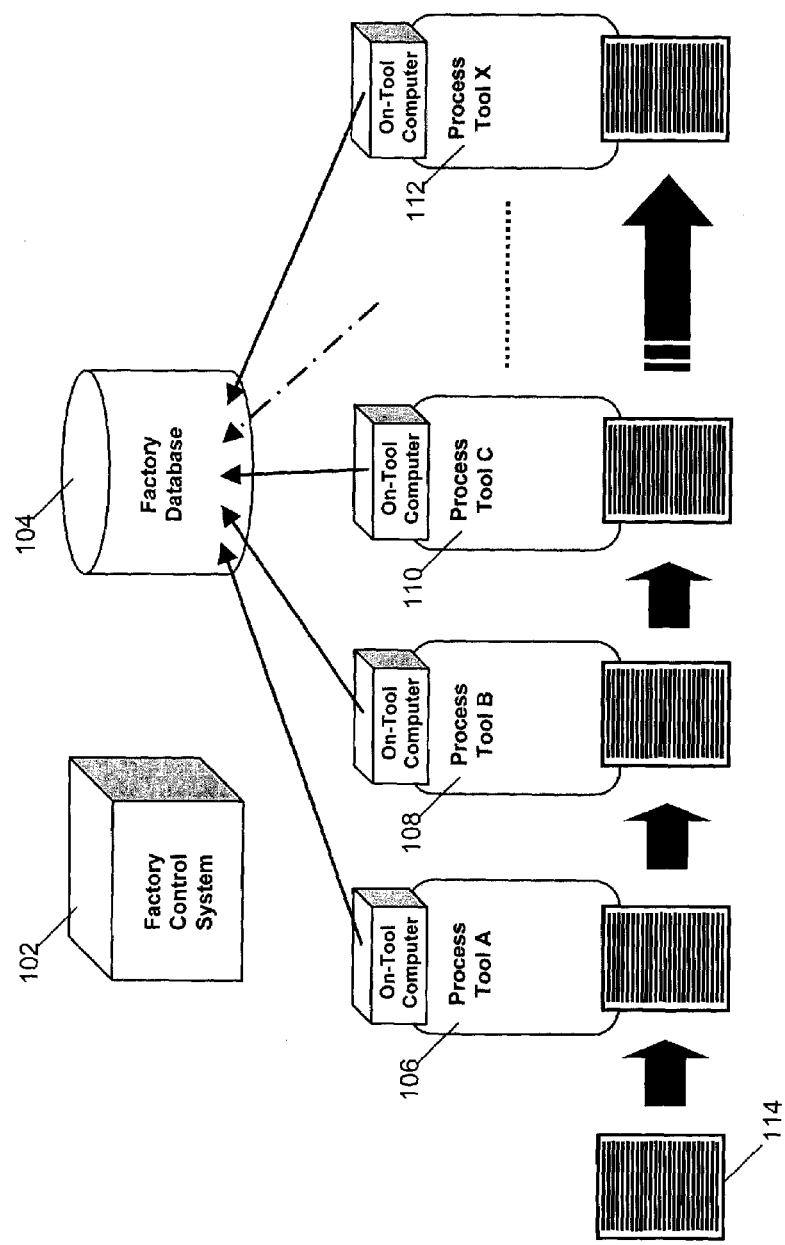
FIG. 3 illustrates a first example of the method for detecting sequential processing effects on integrated circuits to be manufactured in a manufacturing process in accordance with the present invention.

FIG. 3 illustrates a first example of the method for detecting sequential processing effects on integrated circuits to be manufactured in a manufacturing process in accordance with the present invention. In the first example, the on-tool computers of the process tools 106–112 generate the random sequences. Thus, process tool 106 generates a first random sequence for the wafers 114, via step 202. The process tool 106 then performs the first process step on the wafers 114 in accordance with the first random sequence that it generated, via step 204. The wafers 114 move to the next process tool 108. The process tool 108 then generates a second random sequence for the wafers 114, via step 206. The process tool 108 then performs the second process step on the wafers 114 in accordance with the second random sequence that it generated, via step 208. Each of the remaining process tools 110–112 also generates a random sequence and then performs its respectively process steps in accordance with the random sequence that it generated. The process tools 106–112 send the random sequences they each respectively generated and implemented to the factory database 104 for storage.

When all of the processing steps have been performed on the wafers 114, yield or device data for the wafers 114 are collected, via step 210. In the preferred embodiment, one or more testers (not shown) are used to measure and collect the yield or device data. An example device data includes transistor threshold voltage across each wafer, but other variables may be used. After the yield or device data are collected, graphs of the yields or device data versus the processing sequences of the wafers 114 are generated. The collection of the yield or device data and the analysis of the resulting graphs are further explained in U.S. Pat. Nos. 5,761,065, 5,716,856, and 5,930,138, all assigned to the assignee of the present invention. Applicant hereby incorporates these applications by reference.

Figure 4:
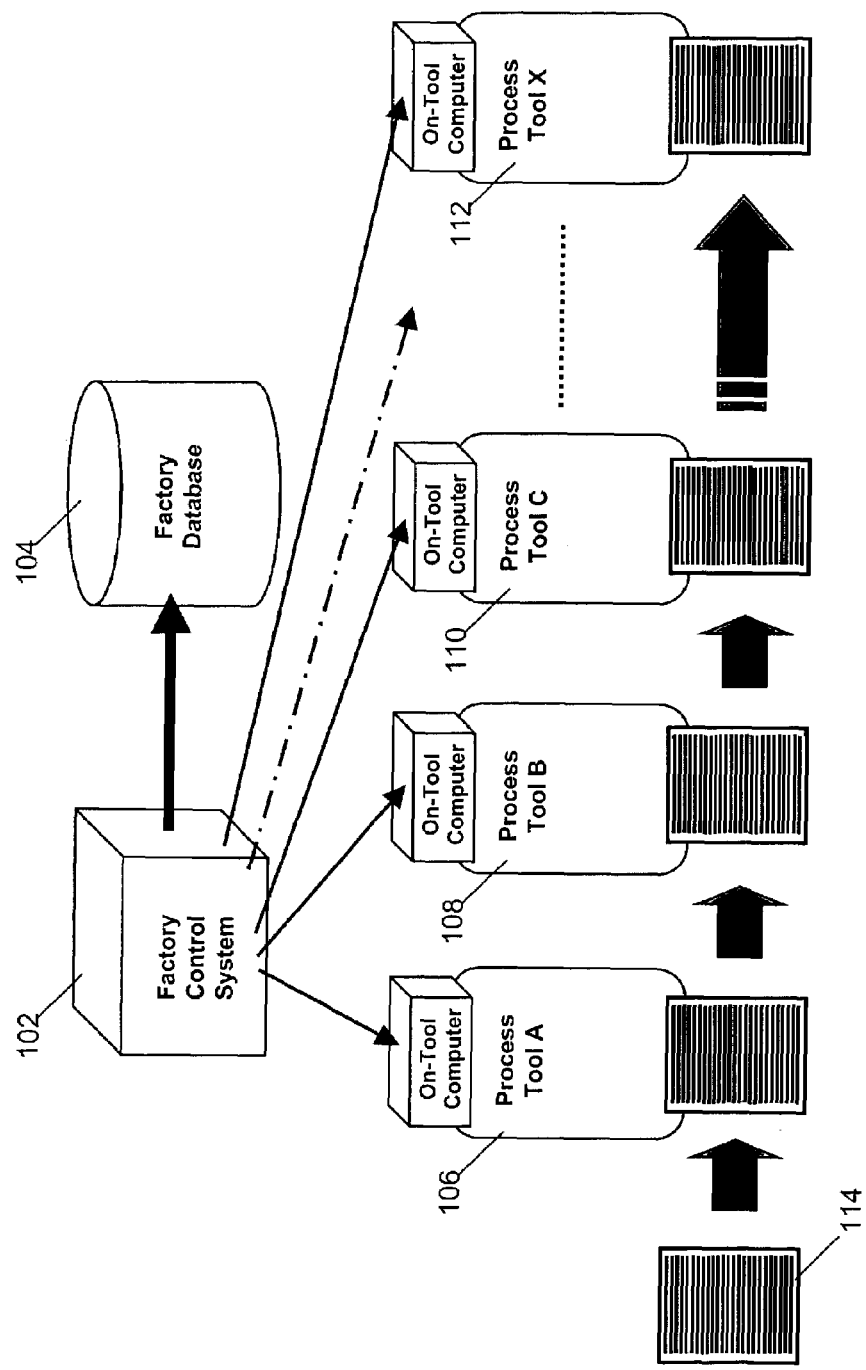
FIG. 4 illustrates a second example of the method for detecting sequential processing effects on integrated circuits to be manufactured in a manufacturing process in accordance with the present invention.

FIG. 4 illustrates a second example of the method for detecting sequential processing effects on integrated circuits to be manufactured in a manufacturing process in accordance with the present invention. In the second example, the factory control system 102 generates the random sequences, via steps 202 and 206. Thus, the process tool 106 then performs the first process step on the wafers 114 in accordance with the first random sequence generated by the factory control system 102, via step 204. The lot 114 moves to the next process tool 108. The process tool 108 then performs the second process step on the wafers 114 in accordance with the second random sequence generated by the factory control system 102, via step 208. Each of the remaining process tools 110–112 performs its respective process steps in accordance with the random sequences generated by the factory control system 102. The random sequences generated by the factory control system 102 and implemented by the process tools 106–112 are sent to the factory database 104 for storage. Steps 210–214 are then performed as described above. This second example is useful if the process tools 106–112 are not capable of generating random sequences.

In a third example, the first and second examples are combined. For some of the process tools 106–112, the tools themselves generate the random sequences, while for the other process tools, the factory control system 102 generates the random sequences. This is useful when the process tools 106–112 are manufactured by different vendors or are of different models, and less than all of them are capable of generating random sequences.

In a fourth example, instead of generating random sequences as each lot is processed, the random sequences are pre-generated by the process tools 106–112. The same set of pre-generated random sequences is then used for the processing of all lots at that step.

In a fifth example, the random sequences are pre-generated as in the fourth example, except the pre-generation is performed by the factory control system 102.

In the fourth and fifth examples, by pre-generating the random sequences that are used for the processing of multiple lots, storage of random sequences is reduced to the pre-generated sequence, rather than a set of sequences for each lot.

In a sixth example, some of the random sequences are generated during the processing of the wafers 114, either by the process tools 106–112 or the factory control system 102, while the rest of the random sequences are pre-generated, either by the process tools 106–112 or the factory control system 102.

In a seventh example, the random sequences are generated by less than all of the process tools 106–112 and randomization is performed at less than all of the process tools 106–112. This example is helpful for process steps at which randomization may be undesirable due to the nature of the process steps, such as when contamination may be increased by the randomization process.

In an eighth example, the randomization is performed at less than all of the process tools 106–112 as in the seventh example, except the random sequences are generated by the factory control system 102.

In each of the examples above, the randomization of the wafer orders can be accomplished in three ways. In the first way, each wafer is fixed to a slot in the cassette, and the wafers 114 are removed for processing according to the corresponding random sequence. For example, wafer 1 is fixed to slot 1 in the cassette, wafer 2 is fixed to slot 2 in the cassette, wafer 3 is fixed to slot 3 in the cassette, etc. Assume that a first random sequence for a first process step is wafer 3-1-2. During the first process step, wafer 3 is first removed from slot 3, processed, and then placed in slot 3 of the cassette. Next, wafer 1 is removed from slot 1, processed, and then placed in slot 1 of the cassette. Then, wafer 2 is removed from slot 2, processed, and then placed in slot 2 of the cassette. The cassette is then moved to the next process tool 108. Alternatively, the wafers can be placed in a different cassette prior to moving to the process tool 108.

Assume that a second random sequence for a second process step is wafer 2-3-1. During the second process step, wafer 2 is removed from slot 2, processed, and then placed in slot 2 of the cassette. Next, wafer 3 is removed from slot 3, processed, and then placed in slot 3 of the cassette. Then, wafer 1 is removed from slot 1, processed, and then placed in slot 1 of the cassette. The cassette is then moved to the next process tool 110. Alternatively, the wafers can be placed in a different cassette prior to moving to the process tool 110.

In the second way, the wafers 114 are placed in the slots according to the random sequences. Each process tool then performs its process step in the same slot order. For example, assume that a first random sequence for a first process is wafer 3-1-2, and a second random sequence for a second process is wafer 2-3-1. Prior to the first process step, wafer 3 is placed in slot 1, wafer 1 is placed in slot 2, and wafer 2 is placed in slot 3. Then, during the first process step, the first process tool removes the wafer 3 in slot 1, processes it, and then places wafer 3 into slot 2 of the cassette for process tool 108. Next, the first process tool 106 removes wafer 1 in slot 2, processes it, and then places wafer 1 into slot 3 of the cassette for process tool 108. Then, the first process tool 106 removes the wafer 2 in slot 3, processes it, and then places wafer 2 in slot 1 of the cassette for process tool 108. When the first process tool 106 is finished, the order in which the processed wafers are placed in the next cassette correspond to the second random sequence. The second process tool then removes the wafers in slot number order, as with the first process tool, processes them, and places them in the slots of the next cassette according to a random sequence for the next process step.

In the third way, the wafers 114 are not arranged to match slot numbers. Instead, they are randomly placed in the cassette. A wafer-identification (wafer-ID)-reading apparatus on the process tool is used to read the ID numbers on the wafers.

The ways of randomization above can be applied to each of the example methods described above.

Although the preferred embodiment is described above for manufacturing semiconductor wafer lots, one of ordinary skill in the art will understand that the method and system can also be used for other types of sequential batch manufacturing without departing from the spirit and scope of the present invention.

A method for detecting sequential processing effects on devices to be manufactured in a manufacturing process has been disclosed. The method performs randomization of wafer processing sequences at the process tool itself. The random sequences can be generated either by the process tools or a factory control system. The random sequences can be generated during the processing of each lot of wafers or pre-generated and used for the processing of each lot. Randomization can be performed at each process tool or at less than all of the process tools. By performing randomization of wafer processing sequences at the process tool, the need for separate wafer handlers is eliminated, resulting in significant cost and clean-room space savings. By removing the extra wafer handling by the wafer handlers, yield for each wafer and the manufacturing cycle time is improved. By performing randomization at more of the process tools, signal-detection capabilities are improved.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for detecting sequential processing effects on integrated circuits to be manufactured in manufacturing process, comprising the steps of:
   (a) predetermining a first random sequence for a plurality of units in a batch of units;
   (b) performing a first process step on the plurality of units by a first process tool in accordance with the first random sequence, wherein the performing step comprises:
      (b1) associating each of the plurality of units with a slot in a cassette;
      (b2) removing each of the plurality of units according to the first random sequence by the first process tool;
      (b3) performing the first process step on each of the removed units by the first process tool; and
      (b4) replacing each of the units into its associated slot by the first process tool;
   (c) determining a second random sequence for the plurality of units; and
   (d) performing a second process step on the plurality of units by a second process tool in accordance with the second random sequence.

2. A method for detecting sequential processing effects on integrated circuits to be manufactured in a manufacturing process, comprising the steps of:
   (a) predetermining a first random sequence for a plurality of wafers;

(b) performing a first process step on the plurality of wafers by a first process tool in accordance with the first random sequence, wherein the performing step comprises:
 (b1) associating each of the plurality of wafers with a slot in a cassette;
 (b2) removing each of the plurality of wafers according to the first random sequence by the first process tool;
 (b3) performing the first process step on each of the removed wafers by the first process tool; and
 (b4) replacing each of the wafers into its associated slot by the first process tool;
(c) determining a second random sequence for the plurality of wafers; and
(d) performing a second process step on the plurality of wafers by a second process tool in accordance with the second random sequence.

3. The method of claim 2, further comprising:
(e) collecting yield or device data for the plurality of wafers;
(f) generating yield or device data versus processing sequence graphs based on the collected yield or device data; and
(g) determining if any of the graphs indicate a systemic wafer-to-wafer variation.

4. The method of claim 2, wherein the determining step (a) comprises:
 (a1) generating the first random sequence for the plurality of wafers by the first process tool.

5. The method of claim 4, wherein the determining step (a) further comprises:
 (a2) sending the first random sequence to a factory database.

6. The method of claim 2, wherein the determining step (c) comprises:
 (c1) generating the second random sequence for the plurality of wafers by the second process tool.

7. The method of claim 6, wherein the determining step (c) further comprises:
 (c2) sending the second random sequence to a factory database.

8. The method of claim 2, wherein the determining step (a) comprises:
 (a1) generating the first random sequence for the plurality of wafers by a factory control system.

9. The method of claim 2, wherein the determining step (c) comprises:
 (c1) generating the second random sequence for the plurality of wafers by a factory control system.

10. The method of claim 2, wherein the determining step (a) comprises:
 (a1) generating the first random sequence, wherein the first random sequence applies to multiple lots of wafers.

11. The method of claim 10, wherein the generating step (a1) is performed by the first process tool.

12. The method of claim 10, wherein the generating step (a1) is performed by a factory control system.

13. The method of claim 2, wherein the determining step (c) comprises:
 (c1) generating the second random sequence, wherein the second random sequence applies to multiple lots of wafers.

14. The method of claim 13, wherein the generating step (c1) is performed by the second process tool.

15. The method of claim 13, wherein the generating step (c1) is performed by a factory control system.

16. The method of claim 2, wherein the performing step (d) comprises:
 (d1) removing each of the plurality of wafers according to the second random sequence by the second process tool; and
 (d2) performing the second process step on each of the removed wafers by the second process tool.

17. The method of claim 2, further comprising:
(e) determining a random sequence corresponding to each of remaining process steps of the manufacturing process; and
(f) performing each of the remaining process steps on the plurality of wafers by a corresponding process tool in accordance with the corresponding random sequence.

18. A system comprising:
a plurality of wafers;
a first processing tool, wherein the first processing tool contains a first computer, wherein the first processing tool removes each of the plurality of wafers from a cassette according to a first predetermined random sequence; wherein each of the plurality of wafers is associated with a slot in the cassette, wherein the first processing tool performs a first process step on the plurality of wafers; wherein the first processing tool replaces each of the plurality of wafers into its associated slot in the cassette;
a second processing tool, wherein the second processing tool contains a second computer, wherein the second processing tool removes each of the plurality of wafers from the cassette according to a second predetermined random sequence; wherein the second processing tool performs a second process step on the plurality of wafers; and
a factory control system, wherein the first computer sends first sequence information to the factory control system, wherein the second computer sends second sequence information to the factory control system.

19. The system of claim 18, wherein the first random sequence is generated by the factory control system.

20. The system of claim 19, wherein the second random sequence is generated by the factory control system.

* * * * *